(12) United States Patent
Kim et al.

(10) Patent No.: US 9,324,762 B1
(45) Date of Patent: Apr. 26, 2016

(54) PROCESS OF FORMING A SEMICONDUCTOR DEVICE

(71) Applicant: Himax Imaging Limited, Tainan (TW)

(72) Inventors: Kihong Kim, Tainan (TW); Desmond Cheung, Tainan (TW); Yang Wu, Tainan (TW)

(73) Assignee: Himax Imaging Limited, Tainan (TW)

( * ) Notice: Subject to any disclaimer, the term of this patent is extended or adjusted under 35 U.S.C. 154(b) by 0 days.

(21) Appl. No.: 14/669,520

(22) Filed: Mar. 26, 2015

(51) Int. Cl.
*H01L 29/78* (2006.01)
*H01L 27/146* (2006.01)
*H01L 21/8238* (2006.01)
*H01L 21/225* (2006.01)

(52) U.S. Cl.
CPC ...... *H01L 27/14689* (2013.01); *H01L 21/2253* (2013.01); *H01L 21/823807* (2013.01)

(58) Field of Classification Search
CPC .............. H01L 2924/00; H01L 21/761; H01L 21/823878; H01L 21/823807
See application file for complete search history.

(56) References Cited

U.S. PATENT DOCUMENTS

| 5,108,944 | A | * | 4/1992 | Shirai | H01L 21/761 148/DIG. 31 |
|---|---|---|---|---|---|
| 5,322,804 | A | * | 6/1994 | Beasom | H01L 21/823462 257/E21.625 |
| 2013/0240955 | A1 | * | 9/2013 | Hirler | H01L 23/481 257/263 |
| 2015/0333169 | A1 | * | 11/2015 | Willmeroth | H01L 29/7802 257/329 |

* cited by examiner

*Primary Examiner* — Jaehwan Oh
(74) *Attorney, Agent, or Firm* — Donald E. Stout; Stout, Uxa & Buyan, LLP

(57) ABSTRACT

A process of forming a semiconductor device includes second-type blanket implanting a first-type semiconductor substrate to form a second-type implant layer therein; second-type implanting the semiconductor substrate through a first mask to form second-type wells in a second region of the semiconductor substrate; and first-type implanting the semiconductor substrate through a second mask to form isolations in a first region of the semiconductor substrate and to compensate complementary sub-regions of the second region.

14 Claims, 4 Drawing Sheets

PROCESS OF FORMING A SEMICONDUCTOR DEVICE

BACKGROUND OF THE INVENTION

1. Field of the Invention

The present invention generally relates to a process of forming a semiconductor device, and more particularly to a process of forming a complementary metal-oxide-semiconductor (CMOS) image sensor with reduced photolithography process.

2. Description of Related Art

Image sensors are used to detect an image by converting, for example, light into electrical signals, and are widely adopted in electronic devices such as cameras. FIG. 1 shows a simplified flow diagram illustrating a typical process of manufacturing CMOS image sensors. In the illustrated flow, each photolithography step defines an area where a portion of a device is to be implanted. Multiple repetitions of the photolithography step and succeeding implant step are required to construct an entire device.

Photolithography is a process used to pattern parts of a semiconductor device such as the image sensor. Photolithography is generally performed by photoresist application, exposure, development and removal. As tens of photolithography steps are required to construct an entire device, they incur substantive manufacturing cost and cycle time.

In order to bring manufacturing cost lower and thus to gain higher profit margin, a need has arisen to propose a novel scheme for manufacturing an image sensor in a cost-effective manner.

SUMMARY OF THE INVENTION

In view of the foregoing, it is an object of the embodiment of the present invention to provide a process of forming a semiconductor device, particularly a CMOS image sensor, with reduced photolithography process without degrading device performance.

According to one embodiment, a first-type semiconductor substrate that includes at least a first region and a second region is provided. The semiconductor substrate is second-type blanket implanted to form a second-type implant layer therein. Next, a first mask is applied on the semiconductor substrate to define a plurality of second-type wells for the second region. The semiconductor substrate is then second-type implanted through the first mask to form the second-type wells in the second region. Subsequently, a second mask is applied on the semiconductor substrate to define a plurality of isolations for the first region and to define a plurality of complementary sub-regions that are complementary to the second-type wells for the second regions. The semiconductor substrate is then first-type implanted through the second mask to form the isolations in the first region and to compensate the complementary sub-regions of the second region.

DETAILED DESCRIPTION OF THE INVENTION

Figure 1:
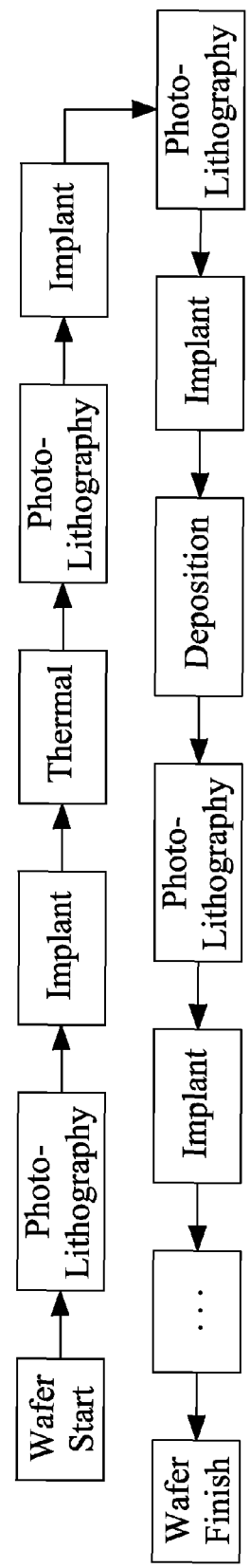
FIG. 1 shows a simplified flow diagram illustrating a typical process of manufacturing CMOS image sensors.
Figure 2A:
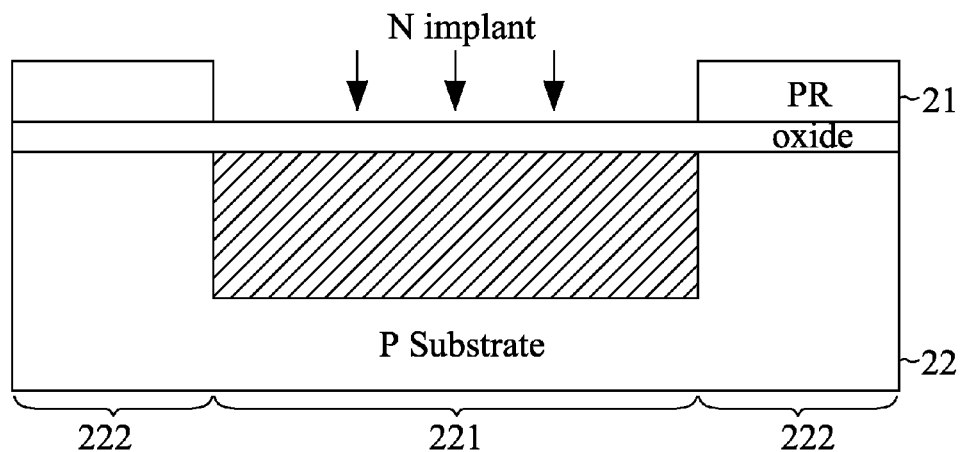
FIG. 2A to FIG. 2C show cross-sectional views illustrating a semiconductor process of forming a CMOS image sensor.
Figure 2B:
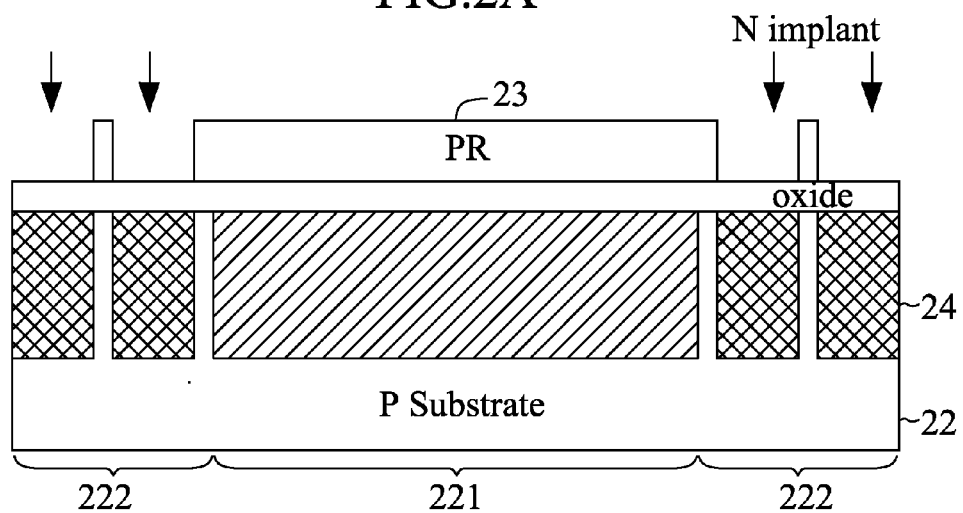
Figure 2C:
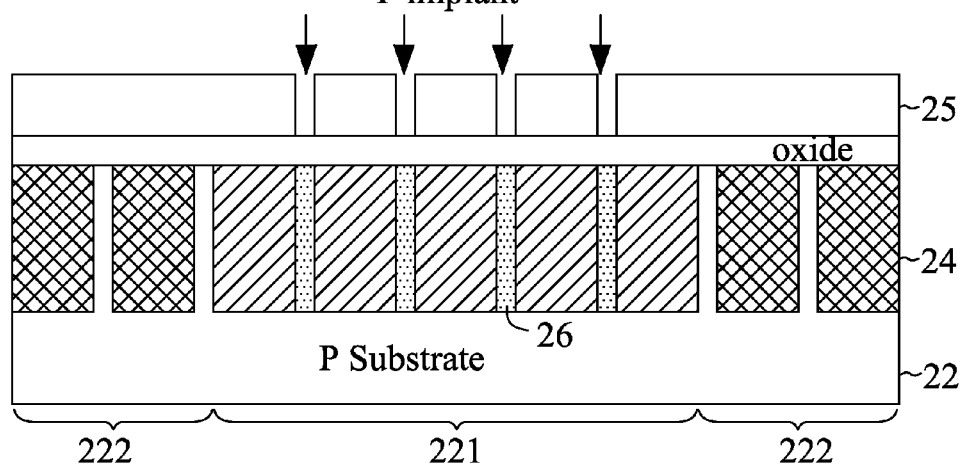

FIG. 2A to FIG. 2C show cross-sectional views exemplifying a semiconductor process of forming a complementary metal-oxide-semiconductor (CMOS) image sensor. In a first photolithography step shown in FIG. 2A, a photoresist (PR) layer 21 is applied on a P-type substrate 22, followed by N-type implant to form N-type photo diode in a pixel region 221 of the P-type substrate 22. Next, in a second photolithography step shown in FIG. 2B, a photoresist layer 23 is applied, followed by N-type implant to form logic N-well 24 in a logic region 222 of the P-type substrate 22. Subsequently, in a third photolithography step shown in FIG. 2C, a photoresist layer 25 is applied, followed by P-type implant to form photo diode isolations 26 in a pixel region 221 of the P-type substrate 22.

Figure 3A:
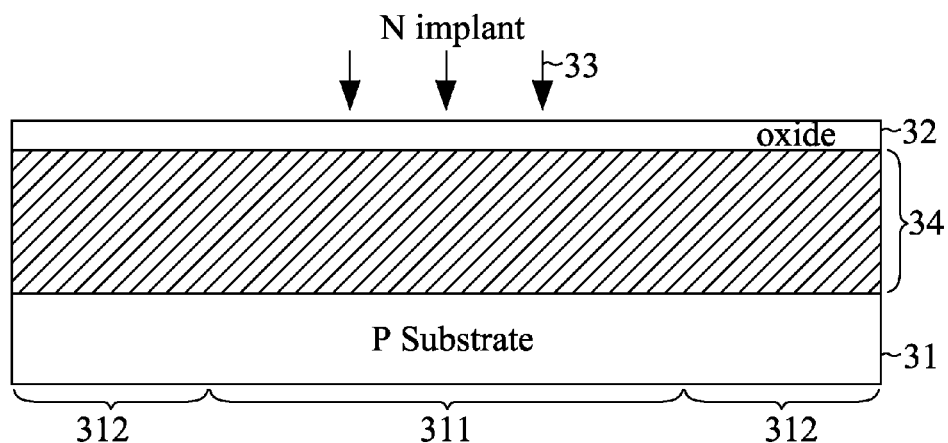
FIG. 3A to FIG. 3C show cross-sectional views illustrating a process of forming a CMOS image sensor according to a first embodiment of the present invention.

It is observed that one photolithography step should accompany each implant step in the process shown in. FIGS. 2A-2C. In order to bring cost lower and thus to gain higher profit margin, a modified process of forming a CMOS image sensor is proposed as shown in the cross-sectional views of FIG. 3A to FIG. 3C according to a first embodiment of the present invention. Although the process demonstrated in FIGS. 3A-3C is directed to form a CMOS image sensor, it is appreciated, however, that the proposed process may be generally adapted to from a semiconductor device other than the CMOS image sensor.

Specifically speaking, referring to FIG. 3A, a first-type semiconductor substrate ("substrate" hereinafter) 31 is provided. In the embodiment, the substrate 31 is P-type. A surface portion of the substrate 31 may include a passivation layer 32 such as an oxide layer. The substrate 31 may be composed of at least two regions. In the example, the substrate 31 has two regions: a pixel region 311 that accommodates a pixel array and a logic region 312 that accommodates a logic circuit. Generally speaking, the substrate 31 may be composed of at least a first region 311 and a second region 312, which may accommodate different devices or circuits, respectively.

Subsequently, still referring to FIG. 3A, second-type (e.g., N-type) blanket implant 33 is performed such that second-type (e.g., N-type) ions may be implanted into the substrate 31, thereby forming a second-type implant layer 34 disposed in the substrate and disposed below the passivation layer 32. In the specification, blanket implant is opposite of masked implant. In other words, blanket implant in the specification means an implant step without photolithography process or without using a mask (such as photoresist). The second-type blanket implant 33 may be followed by a thermal annealing for damage recovery.

Figure 3B:
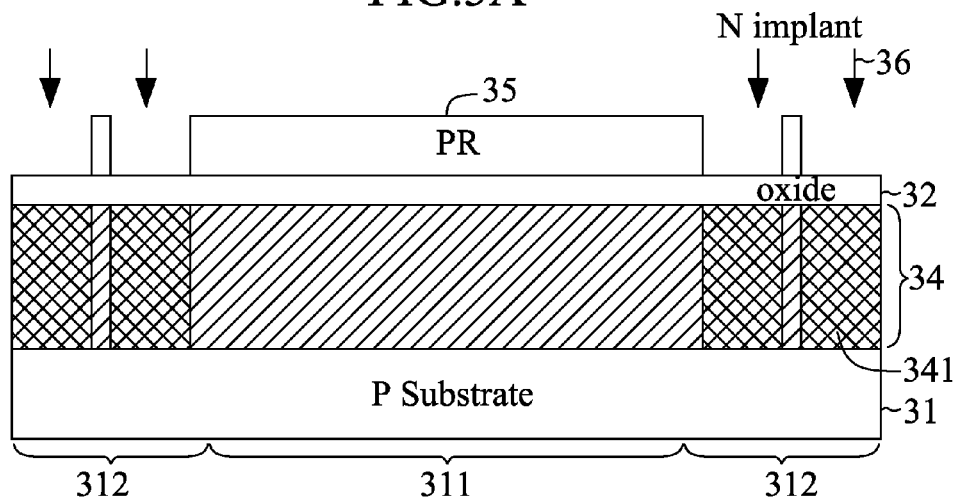
Figure 3C:
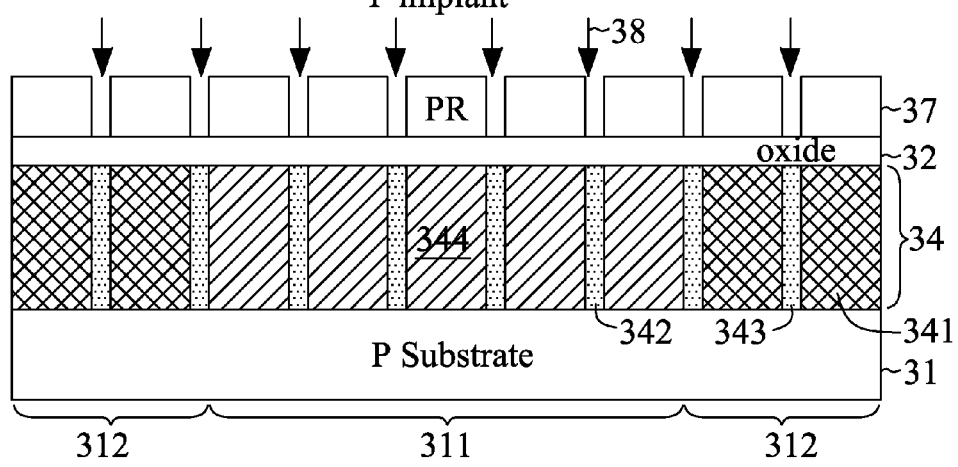

Referring to FIG. 3B, a first mask 35 (such as photoresist) is applied on the substrate 31 to define second-type wells 341 for the second region 312 (e.g., the logic region). Subsequently, second-type (e.g., N-type) implant 36 is performed such that second-type (e.g., N-type) ions may be implanted into the second-type implant layer 34, thereby forming the second-type wells 341. The first mask 35 is then removed. Accordingly, it is noted the dose of the second-type well 341 is higher than the dose of the first region 311 (e.g., pixel region). The second-type implant 36 may be followed by a thermal annealing.

Referring to FIG. 3C, a second mask 37 (such as photoresist) is applied on the substrate 31 to define isolations 342 for the first region 311 (e.g., the pixel region), and to define complementary sub-regions 343 that are complementary to the second-type wells 341 for the second region 312 (e.g., the logic region). Subsequently, first-type (e.g., P-type) implant 38 is performed such that first-type (e.g., P-type) ions may be implanted into the second-type implant layer 34, thereby forming the isolations 342 in the first region, and compensating the second-type ions in the complementary sub-regions 343 of the second region 312. The second mask 37 is then removed. Accordingly, regarding the first region 311, photo diodes (PDs) 344 are separated by the isolations 342 to form a pixel array; and regarding the second region 312, the complementary sub-regions 343 are converted from second-type (e.g., N-type) to first-type (e.g., P-type). The first-type implant 38 may be followed by a thermal annealing.

According to the embodiment described above, one photolithography process or mask layer has been reduced as compared to FIGS. 2A-2C. Cost may thus be reduced and higher profit margin may be obtained. Moreover, reducing mask layers may also contribute to reduce cycle time of wafer processing. The process proposed in FIGS. 3A-3C may be repeated several times at different process stages to obtain better photo diode structure. Generally speaking, the proposed process may represent just a portion of a complete wafer processing, and multiple proposed processes may be implemented in a complete wafer processing to reduce or skip more photolithography processes or mask layers.

Figure 4A:
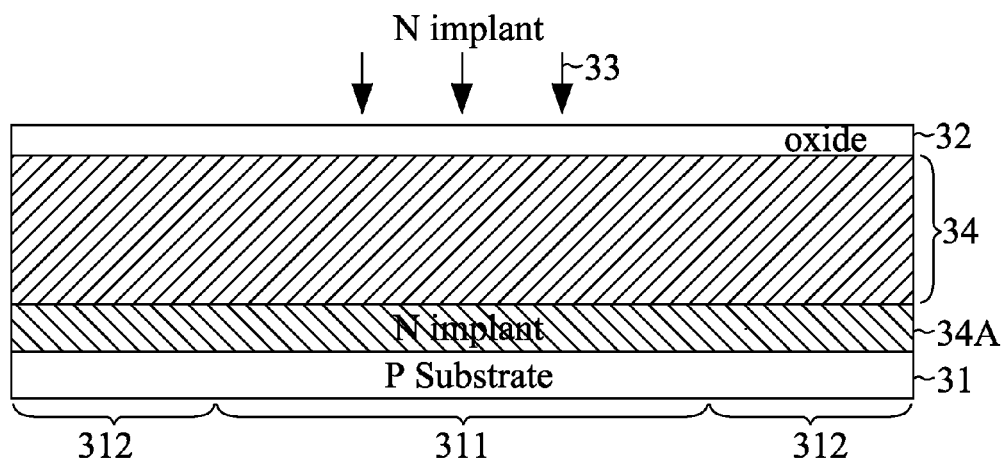
FIG. 4A to FIG. 4C show cross-sectional views illustrating a process of forming a CMOS image sensor according to a second embodiment of the present invention.
Figure 4B:
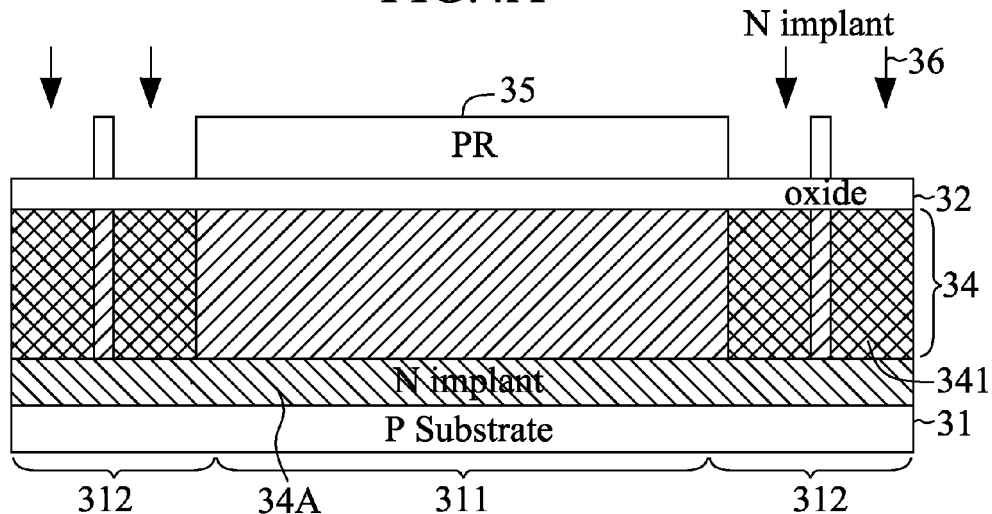
Figure 4C:
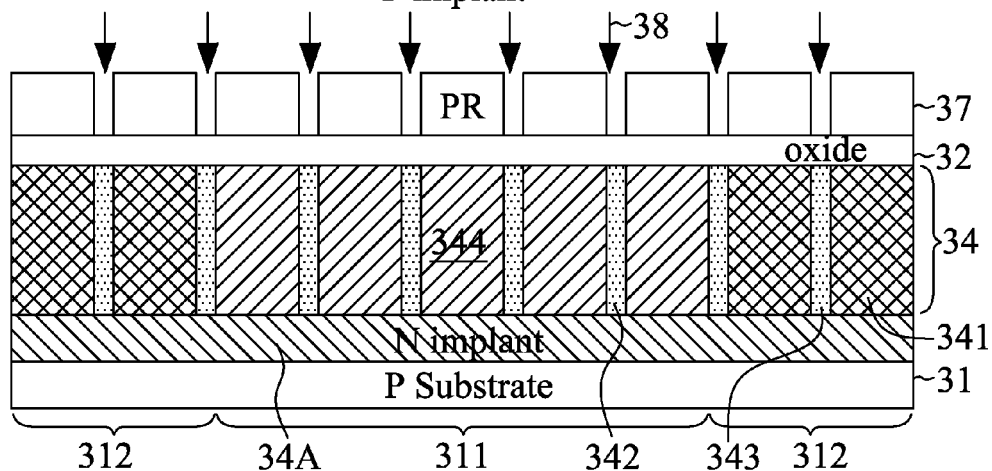

FIG. 4A to FIG. 4C show cross-sectional views illustrating a process of forming a CMOS image sensor according to a second embodiment of the present invention. The present embodiment is similar to the previous embodiment of FIGS. 3A-3C with the exception that, prior to forming the second-type implant layer 34, at least one additional second-type (e.g., N-type) blanket implant is performed to form an additional second-type implant layer 34A that is disposed below the second-type implant layer 34. In the embodiment, the dose of the additional second-type implant layer 34A is different from the dose of the second-type implant layer 34.

Although specific embodiments have been illustrated and described, it will be appreciated by those skilled in the art that various modifications may be made without departing from the scope of the present invention, which is intended to be limited solely by the appended claims.

What is claimed is:

1. A process of forming a semiconductor device, comprising:
   providing a first-type semiconductor substrate, which includes at least a first region and a second region;
   second-type blanket implanting the semiconductor substrate to form a second-type implant layer therein;
   applying a first mask on the semiconductor substrate to define a plurality of second-type wells for the second region;
   second-type implanting the semiconductor substrate through the first mask to form the second-type wells in the second region;
   applying a second mask on the semiconductor substrate to define a plurality of isolations for the first region and to define a plurality of complementary sub-regions that are complementary to the second-type wells for the second regions; and
   first-type implanting the semiconductor substrate through the second mask to form the isolations in the first region and to compensate the complementary sub-regions of the second region.

2. The process of claim 1, wherein the first-type is P-type, and the second-type is N-type.

3. The process of claim 1, further comprising a step of forming a passivation layer in a surface portion of the semiconductor substrate.

4. The process of claim 3, wherein the passivation layer comprises an oxide layer.

5. The process of claim 1, further comprising a thermal annealing step following the second-type blanket implanting step, the second-type implanting step, or the first-type implanting step.

6. The process of claim 1, prior to second-type blanket implanting the semiconductor substrate, further comprising performing at least one additional second-type blanket implanting step to form an additional second-type implant layer that is disposed below the second-type implant layer.

7. The process of claim 6, wherein dose of the additional second-type implant layer is different from dose of the second-type implant layer.

8. A process of forming an image sensor, comprising:
   providing a first-type semiconductor substrate, which includes at least a pixel region and a logic region, the pixel region accommodating a pixel array and the logic region accommodating a logic circuit;
   second-type blanket implanting the semiconductor substrate to form a second-type implant layer therein;
   applying a first mask on the semiconductor substrate to define a plurality of second-type wells for the logic region;
   second-type implanting the semiconductor substrate through the first mask to form the second-type wells in the logic region;
   applying a second mask on the semiconductor substrate to define a plurality of isolations for the pixel region and to define a plurality of complementary sub-regions that are complementary to the second-type wells for the logic regions; and
   first-type implanting the semiconductor substrate through the second mask to form the isolations in the pixel region and to compensate the complementary sub-regions of the logic region.

9. The process of claim 8, wherein the first-type is P-type, and the second-type is N-type.

10. The process of claim 8, further comprising a step of forming a passivation layer in a surface portion of the semiconductor substrate.

11. The process of claim 10, wherein the passivation layer comprises an oxide layer.

12. The process of claim 8, further comprising a thermal annealing step following the second-type blanket implanting step, the second-type implanting step, or the first-type implanting step.

13. The process of claim 8, prior to second-type blanket implanting the semiconductor substrate, further comprising performing at least one additional second-type blanket implanting step to form an additional second-type implant layer that is disposed below the second-type implant layer.

14. The process of claim 13, wherein dose of the additional second-type implant layer is different from dose of the second-type implant layer.

* * * * *